(12) United States Patent
Baker-O'Neal et al.

(10) Patent No.: US 8,901,414 B2
(45) Date of Patent: *Dec. 2, 2014

(54) PHOTOVOLTAIC CELLS WITH COPPER GRID

(75) Inventors: Brett C. Baker-O'Neal, Sleepy Hollow, NY (US); Qiang Huang, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

This patent is subject to a terminal disclaimer.

(21) Appl. No.: 13/232,648

(22) Filed: Sep. 14, 2011

(65) Prior Publication Data

US 2013/0061916 A1 Mar. 14, 2013

(51) Int. Cl.
| | |
|---|---|
| H01L 31/00 | (2006.01) |
| C25D 7/12 | (2006.01) |
| C25D 5/50 | (2006.01) |
| C25D 5/12 | (2006.01) |
| H01L 31/0224 | (2006.01) |
| C25D 5/00 | (2006.01) |

(52) U.S. Cl.
CPC ........ H01L 31/022425 (2013.01); C25D 7/126 (2013.01); C25D 5/50 (2013.01); Y02E 10/50 (2013.01); C25D 5/12 (2013.01); C25D 5/006 (2013.01); C25D 7/12 (2013.01)
USPC ............................ 136/256; 136/252; 136/265

(58) Field of Classification Search
CPC ........................ H01L 31/022425; Y02E 10/50
USPC .......................................... 136/252, 265, 256
See application file for complete search history.

(56) References Cited

U.S. PATENT DOCUMENTS

| | | | |
|---|---|---|---|
| 7,736,935 | B2 | 6/2010 | Faure et al. |
| 8,257,998 | B2 * | 9/2012 | Sachs et al. ..................... 438/71 |
| 2002/0115292 | A1 | 8/2002 | Andricacos et al. |
| 2010/0003817 | A1 | 1/2010 | Hamm et al. |
| 2011/0162701 | A1 * | 7/2011 | Truzzi et al. .................. 136/256 |
| 2011/0309508 | A1 | 12/2011 | Cabral, Jr. et al. |
| 2013/0026635 | A1 * | 1/2013 | Yang et al. .................... 257/762 |

FOREIGN PATENT DOCUMENTS

| | | |
|---|---|---|
| WO | WO2008100603 | 8/2008 |
| WO | WO2009114446 | 9/2009 |
| WO | WO2011054037 | 5/2011 |

OTHER PUBLICATIONS

Bartsch, J., et al., "Copper as Conducting Layer in Advanced Front Side Metallization Processes for Crystalline Silicon Solar Cells, Exceeding 20% on Printed Seed Layers", 35th PVSC, Jun. 20-25, 2010, Honolulu, Hawaii.

(Continued)

*Primary Examiner* — Tamir Ayad
(74) *Attorney, Agent, or Firm* — Scully, Scott, Murphy & Presser, P.C.; Louis J. Percello, Esq.

(57) ABSTRACT

A photovoltaic device, such as a solar cell, having improved performance is provided. The photovoltaic device includes a copper-containing layer that contains an amount of impurities therein which is sufficient to hinder the diffusion of copper into an underlying semiconductor substrate. The copper-containing layer, which is located within a grid pattern formed on a front side surface of a semiconductor substrate, includes an electroplated copper-containing material having an impurity level of 200 ppm or greater located atop at least one metal diffusion barrier layer.

16 Claims, 6 Drawing Sheets

(56) References Cited

OTHER PUBLICATIONS

Bartsch, J. et al., "Quick Determination of Copper-Metallization Long-Term Impact on Silicon Solar Cells", J. Electrochem. Soc., Published Aug. 13, 2010, vol. 157, Issue 10, Semiconductor Devices, Materials, and Processing.

Hoerteis, M., et al., "Electrical properties of fine line printed and light-induced plated contacts on silicon solar cells", Progress in Photovoltaics: Research and Applications, Prog. Photovolt: Res. Appl., Published online Mar. 30, 2010 in Wiley InterScience, 18:240-248.

Nguyen, A., et al., "Formation of a Low Ohmic Contact Nickel Silicide Layer on Textured Silicon Wafers Using Electroless Nickel Plating", 25th European Photovoltaic Solar Energy Conference and Exhibition / 5th World, Conference on Photovoltaic Energy Conversion, Sep. 6-10, 2010, Valencia, Spain, pp. 2672-2675.

Chaudhari, V., et al., "A Novel Two Step Metallization of Ni/Cu for Low Concentrator c-Si Solar Cells", Solar Energy Materials & Solar Cells, Jul. 23, 2010, 94, pp. 2094-2101.

International Search Report and Written Opinion dated Dec. 4, 2012 received in a corresponding foreign application.

Office Action dated Jan. 29, 2014 received in related U.S. Appl. No. 13/604,223.

* cited by examiner

PHOTOVOLTAIC CELLS WITH COPPER GRID

BACKGROUND

The present disclosure relates to a photovoltaic device and a method of manufacturing the same. More particularly, the present disclosure relates to a photovoltaic device, such as a solar cell, having a copper-containing layer that contains an amount of impurities therein with is sufficient to hinder the diffusion of copper into a semiconductor substrate and thus improve the performance of the device. The present disclosure also provides a method for forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped regions, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

The majority of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

For advanced and experimental high efficiency solar cells in laboratories, vacuum based metallization processes are used with an inevitable higher cost and low throughput.

Very recently, metallization with a plated copper grid has been reported. However, the plated copper can easily diffuse into the silicon solar cells and damage the solar cells performance. To prevent this detrimental effect, diffusion barriers, such as nickel silicide and nickel, have been employed. However, even with these diffusion barriers, copper diffusion may still occur at a certain elevated temperature or after a certain long time of operation.

SUMMARY

A photovoltaic device, such as a solar cell, having improved performance, especially in terms of its lifetime, is provided. The photovoltaic device of the present disclosure includes a copper-containing layer that contains an amount of impurities therein which is sufficient to hinder the diffusion of copper into an underlying semiconductor substrate. The copper-containing layer of the present disclosure, which is located within a grid pattern formed on a front side surface of a semiconductor substrate, includes an electroplated copper-containing material having an impurity level of 200 ppm or greater located atop at least one metal diffusion barrier layer. The at least one metal diffusion barrier layer is resistant to copper diffusion and hence comprises a metal or metal alloy that is different from the copper-containing material layer. That is, the at least one metal diffusion barrier layer does not include copper or a copper alloy therein. The at least one metal diffusion barrier layer can also provide other functions such as adhesion layer between the semiconductor substrate and the copper-containing layer. The at least one metal diffusion barrier layer can be a metal, a metal alloy containing more than one metal element, or a metal alloy containing one or more metal elements and non-metal elements. A method of forming such a structure is also provided.

Applicants have determined that the impurity level within a copper-containing grid can affect the performance, particularly the lifetime, of a photovoltaic device. Specifically, applicants have determined that a photovoltaic device including a copper-containing layer having an impurity level of 200 ppm or greater as a grid metallization layer provides an improvement in lifetime over a copper-containing layer whose impurity level is below 200 ppm.

In one embodiment of the present disclosure, a method of forming a photovoltaic device is provided. Specifically, a method is provided that includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate. Next, patterned antireflective coatings are formed on the front side surface of the semiconductor substrate to provide a grid pattern on the front side surface. The grid pattern comprises exposed portions of the front side surface of the semiconductor substrate. At least one metal diffusion barrier layer which does not include copper or a copper alloy is then formed on the exposed portions of the front side surface of the semiconductor substrate. After forming the at least one metal diffusion barrier layer, a copper-containing layer having an impurity level of 200 ppm or greater is electrodeposited atop the at least one metal diffusion barrier layer.

In one embodiment, the n-type semiconductor portion overlies the p-type semiconductor portion. In another embodiment, the p-type semiconductor overlies the n-type semiconductor portion.

In some embodiments of the present disclosure, the at least one metal diffusion barrier layer can include a metal semiconductor alloy layer as a bottom most layer of a multilayered stack, which can be formed on the exposed portions of the front side surface of the semiconductor substrate by annealing a metal layer on the front side surface of the semiconductor substrate.

In another embodiment, a photovoltaic device having improved performance is provided. Specifically, the photovoltaic device of the present disclosure includes a semiconductor substrate including a p-n junction with a p-type semiconductor portion and an n-type semiconductor portion one on top of the other, wherein an upper exposed surface of one of the semiconductor portions represents a front side surface of the semiconductor substrate. The photovoltaic device further includes patterned antireflective coatings on the front side surface of the semiconductor substrate, wherein the patterned antireflective coatings protect some portions of the front side surface of the semiconductor substrate, while leaving other portions of the front side surface of the semiconductor substrate exposed, the other portions of the front side surface of the semiconductor substrate that are exposed form a grid pattern on the front side surface. The photovoltaic device yet further includes at least one metal diffusion barrier layer located on the other portions of the front side surface of the semiconductor substrate that are exposed and a copper-containing layer having an impurity level of 200 ppm or greater located atop the at least one metal diffusion barrier layer. In accordance with the present disclosure, the at least one metal diffusion barrier layer does not include copper or a copper alloy.

In one embodiment, the n-type semiconductor portion overlies the p-type semiconductor portion. In another embodiment, the p-type semiconductor overlies the n-type semiconductor portion.

In some embodiments of the present disclosure, the at least one metal diffusion barrier layer can include a metal semiconductor alloy layer as a bottom most layer of a multilayered stack, which can be formed on the exposed portions of the front side surface of the semiconductor substrate by annealing a metal layer on the front side surface of the semiconductor substrate.

DETAILED DESCRIPTION

The present disclosure, which provides photovoltaic devices, such as solar cells, having improved performance, especially lifetime, and a method of forming such devices will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
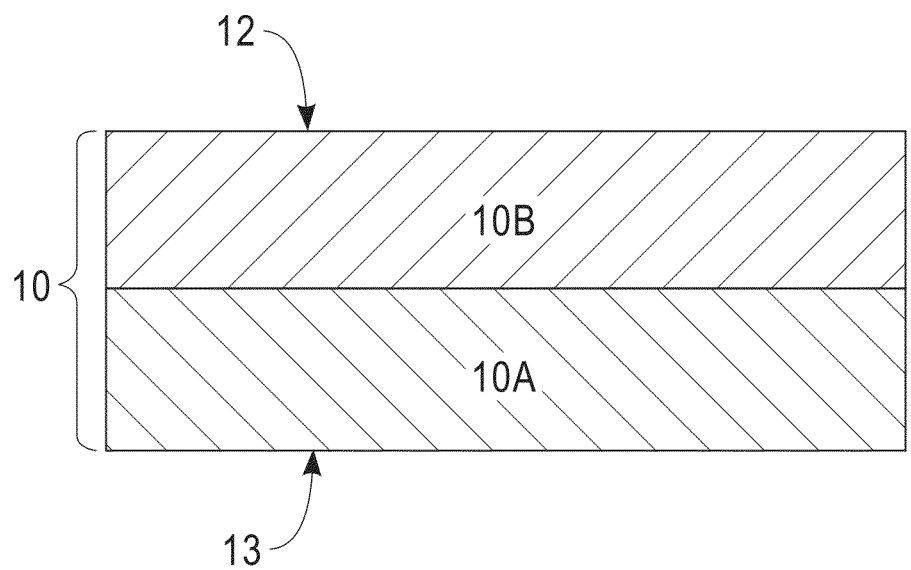
FIG. 1 is a pictorial representation (through a cross sectional view) illustrating an initial structure that can be employed in one embodiment of the present disclosure.

Referring now to FIG. 1, there is illustrated an initial structure 8 that can be employed in one embodiment of the present disclosure. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP, CdTe, CuInSe$_2$, Cu(InGa)Se$_2$, and all other III/V, II/VI, or I/III/VI compound semiconductors. In one embodiment of the present disclosure, the semiconductor substrate 10 is comprised of silicon. In another embodiment, the semiconductor substrate 10 is comprised of a single crystalline semiconductor material. In another embodiment, the semiconductor substrate 10 is comprised of a multicrystalline semiconductor material. In yet another embodiment, the semiconductor substrate 10 is comprised of multiple layers of different semiconductor materials, for example, with different energy band gaps.

The semiconductor substrate 10 illustrated in FIG. 1 includes a p-type semiconductor portion 10A that includes a p-type dopant, and an overlying n-type semiconductor portion 10B that includes an n-type dopant. In some embodiments (not shown), the p-type semiconductor portion of the substrate overlies the n-type semiconductor portion. In such an embodiment, the order of layers 10A and 10B would be reversed from that shown, i.e., layer 10A would be located atop layer 10B. Also, in such an embodiment, an exposed surface of layer 10A would be used as the front side surface of the semiconductor substrate 10.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor substrate and the type of dopant atom being employed. The p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, laser doping, and/or out-diffusion of a dopant atom from an overlying sacrificial dopant material layer that can be formed on the substrate, and removed after the out-diffusion process. In some embodiments of the present disclosure, the dopant(s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of a single crystalline silicon semiconductor substrate. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

Although the following drawings and description illustrate processing the n-type semiconductor portion 10B of the semiconductor substrate 10, the following description can also be applied to processing the p-type semiconductor portion of the semiconductor substrate 10 in embodiments in which the p-type semiconductor portion is located atop the n-type semiconductor portion.

Figure 2:
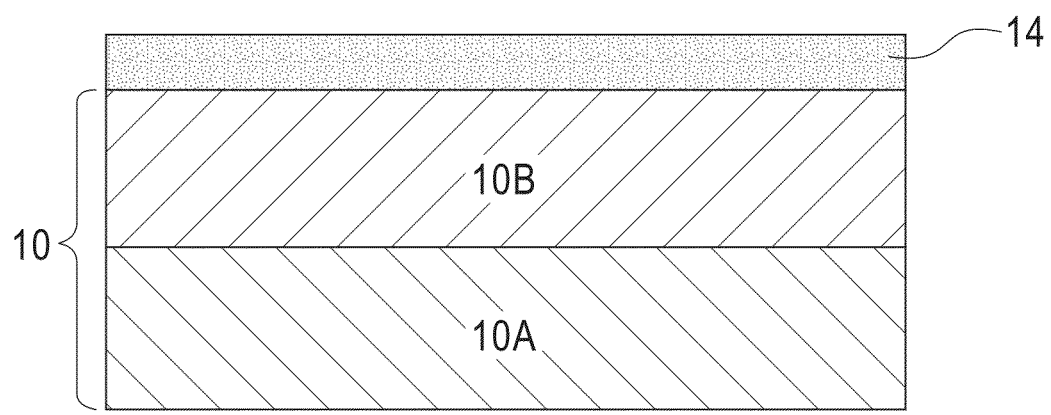
FIG. 2 is a pictorial representation (through a cross sectional view) illustrating the initial structure of FIG. 1 after forming a blanket layer of an antireflective coating on a front side surface of the initial structure.

Referring now to FIG. 2, there is illustrated the structure of FIG. 1 after forming a blanket layer of an antireflective coating (ARC) 14 on the front side surface 12 of the n-type semiconductor portion 10B of the semiconductor substrate 10. Although a single coating is described and illustrated, the ARC 14 employed in the present disclosure may include more than one coating. The blanket layer of ARC 14 that can be employed in the present disclosure includes a conventional ARC material such as, for example, an inorganic ARC or an organic ARC. In one embodiment of the present disclosure, the ARC material comprises silicon nitride. The blanket layer of ARC 14 can be formed utilizing techniques well known to those skilled in the art. For example, an ARC composition can be applied to the front side surface 12 of the semiconductor substrate 10 (i.e., directly onto the exposed upper surface of the n-type semiconductor portion 10B) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

At this point of the present disclosure, the back side surface 13 of the p-type semiconductor portion 10A of the semiconductor substrate 10 may be processed to form a metal back side surface electrical contact (not shown). When the substrate 10 includes a p-type semiconductor portion atop an n-type semiconductor portion, the bottommost surface of the n-type semiconductor portion would represent the back side surface of the substrate which could be processed to include a metal back side surface electrical contact. In one embodiment, the metal back side surface electrical contact can be formed by applying a metallic paste, such as Al paste, Ag paste, or AlAg paste, to the back side surface 13 of the semiconductor substrate 10. After applying the metallic paste, the applied metallic paste is heated at an elevated temperature (typically between 700° C. to 900° C.) which causes the metallic paste to flow and form a metal back surface field, i.e., the back side surface electrical contact, of the structure.

Figure 3:
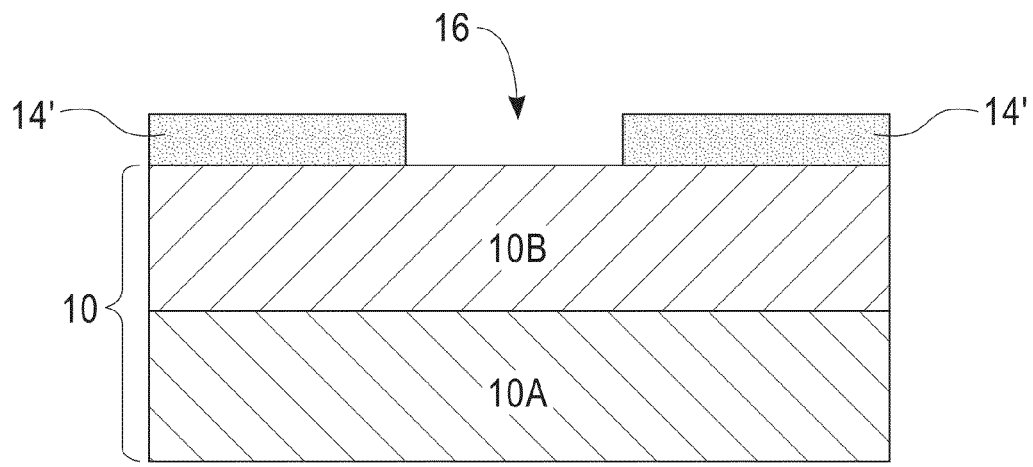
FIG. 3 is a pictorial representation (through a cross sectional view) illustrating the structure of FIG. 2 after patterning the blanket layer of antireflective coating forming a plurality of patterned antireflective coatings having one or a plurality of open grid patterns.

Referring now to FIG. 3, there is illustrated the structure of FIG. 2 after patterning the blanket layer of ARC 14 forming a plurality of patterned antireflective coatings (ARCs) 14' having an open grid pattern 16 located therein. Although the cross sectional drawings show the presence of a single opening formed into the blanket layer of ARC 14, a plurality of such openings would be formed providing a grid pattern to the front side surface 12 of the semiconductor substrate 10. In one embodiment, the plurality of patterned ARCs 14' can be formed by lithography and etching. The lithographic process includes applying a photoresist (not shown) to an upper surface of the blanket layer of ARC 14, exposing the photoresist to a desired pattern of radiation and developing the exposed photoresist utilizing a conventional resist developer. A patterned photoresist is thus provided. The pattern in the photoresist is transferred to the blanket layer of ARC 14 utilizing an etching process such as, for example, dry etching or chemical wet etching. After transferring the pattern from the patterned photoresist to the underlying blanket layer of ARC 14, the patterned photoresist is typically removed from the structure utilizing a conventional resist stripping process such as, for example, ashing. In another embodiment, the blanket layer of ARC 14 can be patterned utilizing ink jet printing or laser ablation. In yet another embodiment, the exposed semiconductor surface 12 in the pattern region 16 of ARC 14 can be further treated to increase the doping level. In these cases, the top semiconductor material 10B is thicker or has higher dopant concentration under the exposed region 16.

Figure 4:
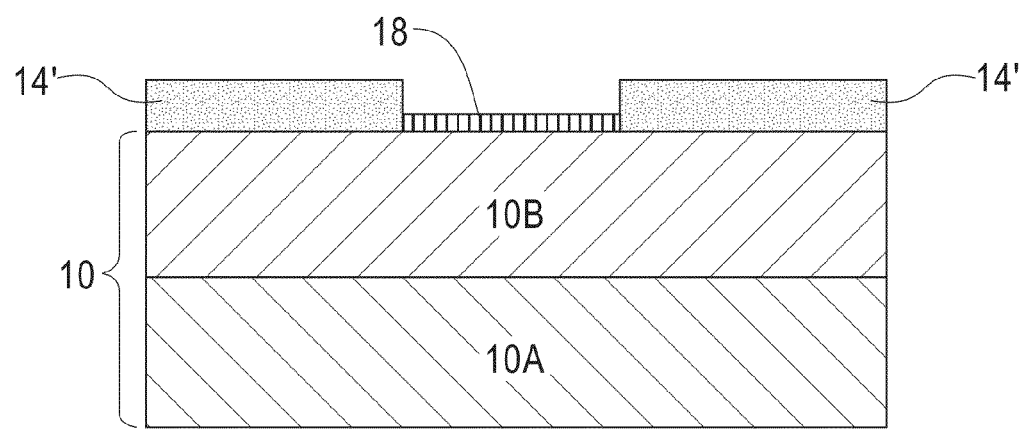
FIG. 4 is a pictorial representation (through a cross sectional view) illustrating the structure of FIG. 3 after forming at least one metal diffusion barrier layer into the open grid pattern.

Referring now to FIG. 4 there is illustrated the structure of FIG. 3 after forming at least one metal diffusion barrier layer 18 within the grid pattern, i.e., on the exposed front side surface 12 of the semiconductor substrate 10, of the structure. In the present disclosure, the at least one metal diffusion barrier layer 18 serves to hinder the diffusion of copper from an overlying copper-containing layer to be subsequently formed.

The at least one metal diffusion barrier layer 18 that is formed includes a metal or metal alloy other than copper or a copper alloy. In one embodiment of the present application, the at least one metal diffusion barrier layer 18 can be comprised of Ni, Co, Zn, Pt, Ag, Pd, Sn, Fe, In or alloys thereof. In another embodiment, the at least one metal diffusion barrier layer 18 may be comprised of Ni, Co, Zn, Pt, Fe or alloys thereof. In a further embodiment of the present disclosure, the at least one metal diffusion barrier layer 18 may be comprised of Ni or a Ni alloy. In a yet further embodiment of the present disclosure, the at least one metal diffusion barrier layer 18 may be comprised of Co or a Co alloy. In any of the embodiments mentioned above, the at least one at least one metal diffusion barrier layer 18 itself does not include copper or a copper alloy.

In one embodiment of the present invention, the at least one diffusion barrier layer 18 is comprised of metal or metal alloys containing more than two metal elements. In another embodiment, the at least one diffusion barrier layer 18 can include a metal alloy with at least one metal element and at least one non-metal element. In yet another embodiment, the at least one diffusion barrier 18 is comprised of Ni, Co, P, S, As, Sb, O, N, and/or C.

The at least one diffusion barrier layer 18 can be formed by electroplating, electroless plating, physical vapor deposition, chemical vapor deposition, atomic layer deposition and other deposition processes. In one embodiment of the present disclosure the at least one diffusion barrier layer 18 is formed by electrodeposition on the exposed front side surface 12 of the semiconductor substrate 10. In another embodiment, the at least one diffusion barrier layer 18 is formed by physical vapor deposition on the exposed front side surface 12 and on the plurality of patterned antireflective coatings (ARCs) 14', followed by the removal of the at least one diffusion barrier layer that is formed on the patterned antireflective coatings (ARCs) 14'.

In some embodiments, and prior to the electrodeposition of the at least one metal diffusion barrier layer 18, the exposed surface(s) of the front side surface 12 of the semiconductor substrate 10 can be cleaned using a conventional cleaning process that is well known to those skilled in the art which is capable of removing surface oxides and other contaminants from the exposed surface(s) of the semiconductor material. For example, a diluted HF solution can be used to clean the exposed front side surface of the semiconductor substrate 10.

The electrodeposition method employed in forming the at least one metal diffusion barrier layer 18 includes the use of any conventional electroplating apparatus that is well known to those skilled in the art. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed portions of the front side surface 12 of the semiconductor substrate 10 (i.e., either the n-type semiconductor portion 10B, if the n-type semiconductor portion is located atop the p-type semiconductor portion, or the p-type semiconductor portion 10A, if the p-type semiconductor portion is located atop the n-type semiconductor portion) are employed as the cathode of the circuit. The anode that is employed in the electrodeposition process may or may not be made of the same metal as to be plated. In the present disclosure, the structure shown in FIG. 3 can be immersed in an electroplating bath (e.g., an electrolyte) containing an anode and one or more dissolved metal salts (to be further defined here below) as well as other ions that permit the flow of electricity. A power supply supplies a direct current to the anode and plating occurs at the cathode (i.e., the exposed front side surface 12 of the semiconductor substrate).

The electroplating bath that can be employed in the present disclosure includes one or more sources of metal ions to plate the at least one metal diffusion barrier layer 18. The one or more sources of metal ions provide metal ions which include, but are not limited to, Ni, Co, Zn, Pt, Ag, Pd, Sn, Fe, In, As, Sb, S, P, O, N, and C. Alloys that can be electrodeposited (or plated) include, but are not limited to, binary and ternary alloys of the foregoing metals. In one embodiment, metals chosen from Ni, Co, Zn, Pt and Fe are plated from the electroplating bath. In another embodiment, Ni or a Ni alloy is plated from the electroplating bath. In yet another embodiment, Co or a Co alloy is plated from the electroplating bath.

The one or more sources of metal ions that can be present in the electroplating bath include metal salts. The metal salts that can be used include, but are not limited to, metal halides, metal nitrates, metal sulfates, metal sulfamates, metal alkane sulfonates, metal alkanol sulfonate, metal cyanides, metal acetates or metal citrates.

Some of the various types of metal salts that can be employed in the present disclosure are now described in greater detail.

Tin (Sn) salts which may be used in the electroplating bath include, but are not limited to, one or more of tin sulfates, tin halides, tin alkane sulfonates such as tin methane sulfonate, tin ethane sulfonate, and tin propane sulfonate, tin aryl sulfonate such as tin phenyl sulfonate and tin toluene sulfonate, and tin alkanol sulfonate. Typically, tin sulfate or tin alkane sulfonate is used in the electroplating bath.

Gold (Au) salts which may be used in the electroplating bath include, but are not limited to, one or more of gold trichloride, gold tribromide, gold cyanide, potassium gold chloride, potassium gold cyanide, sodium gold chloride and sodium gold cyanide.

Silver (Ag) salts which may be used in the electroplating bath include, but are not limited to, one or more of silver nitrate, silver chloride, silver acetate and silver bromate. Typically, silver nitrate is used in the electroplating bath.

Nickel (Ni) salts which may be used in the electroplating bath include, but are not limited to, one or more of nickel chloride, nickel sulfamate, nickel acetate, nickel ammonium sulfate, and nickel sulfate.

Palladium (Pd) salts which may be used in the electroplating bath include, but are not limited to, one or more of palladium chloride, palladium nitrate, palladium potassium chloride and palladium potassium chloride.

Platinum (Pt) salts which may be use include, but are not limited to, one or more of platinum tetrachloride, platinum sulfate and sodium chloroplatinate.

Indium (In) salts which may be used include, but are not limited to, one or more of indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine.

Sources of cobalt (Co) ions include, but are not limited to, one or more of cobalt ammonium sulfate, cobalt acetate, cobalt sulfate and cobalt chloride. Sources of zinc (Zn) ions include, but are not limited to, one or more of zinc bromate, zinc chloride, zinc nitrate and zinc sulfate. Source of iron (Fe) include, but are not limited to, one or more of ferric or ferrous chloride, iron nitrate, iron sulfate, iron acetate, and iron sulfate. Sources of arsenic (As) include, but are not limited to, one or more of sodium arsenate, arsenic oxide, and arsenic acid. Sources of antimony (Sb) include, but are not limited to, one or more of antimony oxide, sodium antimonide, antimony chloride and antimony sulfate. Sources of sulfur (S) include, but are not limited to, one or more of saccharin, thiourea, sulfonic acid, sulfinic acid, sulfonate, and sulfamic acid. Sources of phosphorous (P) include, but are not limited to, one or more of hypophosphite, phosphorous acid, and hypophosphate.

In general, the metal salts are included in the electroplating bath such that metal ions range in concentrations from 0.01 g/L to 200 g/L, or such as from 0.5 g/L to 150 g/L, or such as from 1 g/L to 100 g/L, or such as from 5 g/L to 50 g/L. Typically, metal salts are included in amounts such that metal ion concentrations range from 0.01 to 100 g/L, more typically from 0.1 g/L to 60 g/L.

The electroplating bath that can be used may include one or more conventional diluents. Typically, the electroplating bath is aqueous; however, conventional organic diluents may be used if desired. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds.

Suppressors include, but are not limited to, one or more of oxygen containing high molecular weight compounds such as carboxymethylcellulose, nonylphenolpolyglycol ether, octandiolbis-(polyalkylene glycolether), octanolpolyalkylene glycolether, oleic acid polyglycol ester, polyethylenepropylene glycol, polyethylene glycol, polyethylene glycoldimethylether, polyoxypropylene glycol, polypropylene glycol, polyvinyl alcohol, stearic acidpolyglycol ester, and stearyl alcoholpolyglycol ether. Typically poly(alkoxylated) glycols are used. Such suppressors may be included in the electroplating bath in conventional amounts, such as from 0.01 g/L to 10 g/L, or such as from 0.5 g/1 to 5 g/L.

One or more conventional surfactants may be used. Typically, surfactants include, but are not limited to, nonionic surfactants such as alkyl phenoxy polyethoxyethanols. Other suitable surfactants containing multiple oxyethylene groups also may be used. Such surfactants include compounds of polyoxyethylene polymers having from as many as 20 to 7500 repeating units. Such compounds also may perform as suppressors. Also included in the class of polymers are both block and random copolymers of polyoxyethylene (EO) and polyoxypropylene (PO). Surfactants may be added in conventional amounts, as from 0.5 g/L to 20 g/L, or such as from 5 g/L to 10 g/L.

Conventional levelers include, but are not limited to, one or more of alkylated polyalkyleneimines and organic sulfo sulfonates. Examples of such compounds include 1-(2-hydroxyethyl)-2-imidazolidinethione (HIT), 4-mercaptopyridine, 2-mercaptothiazoline, ethylene thiourea, thiourea, 1-(2-hydroxyethyl)-2-imidazolidinethione (HIT) and alkylated polyalkyleneimines. Such levelers are included in conventional amounts. Typically, such levelers are included in amounts of 1 ppb to 1 g/L, or such as from 10 ppb to 500 ppm.

One or more inorganic and organic acids can be also included in the electroplating bath to increase the solution conductivity of the matrix and also to adjust the pH of the plating composition. Inorganic acids include, but are not limited to, sulfuric acid, hydrochloric acid, nitric acid and phosphoric acid. Organic acids include, but are not limited to, alkane sulfonic acids, such a methane sulfonic acid. Acids are included in the electroplating bath in conventional amounts.

Alkali metal salts which may be included in the electroplating bath include, but are not limited to, sodium and potassium salts of halogens, such as chloride, fluoride and bromide. Typically chloride is used. Such alkali metal salts are used in conventional amounts.

In addition to the above, the electroplating bath may also include hardeners, malleability, ductility and deposition modifiers, and the like.

The measured pH of the electroplating bath may range from −1 to 14, or such as from −1 to 8. Typically, the pH of the electroplating bath ranges from −1 to 5, more typically, from 0 to 3. Conventional buffering compounds may be included to control the pH of the electroplating bath.

The electroplating baths are typically maintained in a temperature range of from 20° C. to 110° C., with a temperature from 20° C. to 50° C. being more typical. Plating temperatures may vary depending on the metal to be plated.

The electrodeposition process employed in forming the at least one metal diffusion barrier layer 18 uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the at least one metal diffusion barrier layer 18.

By "low current density" it is meant a plating density within a range from 1 mAmps/cm$^2$ to 20 mAmps/cm$^2$. By "high current density" it is meant a plating density of greater than 20 mAmps/cm$^2$ (a general range for the high current density regime is from greater than 20 mAmps/cm$^2$ to 200 mAmps/cm$^2$. The increase from the low current density regime to the high current density regime or decrease from the high current density regime to the low current density regime may include a continuous ramp or it may include various ramp and soak cycles including a sequence of constant current plateaus.

In some embodiments of the present disclosure, light illumination can be used to increase metal nucleation and growth during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source can be used. The intensity of the light employed may vary and is typically greater than 50 W/m$^2$, with an intensity of light from 100 W/m$^2$ to 500 W/m$^2$ being more typical. The combination of the aforementioned waveform and light illumination enables one to provide complete coverage of a metallic film on the surface of a semiconductor substrate used in solar cell applications.

The thickness of the at least one metal diffusion barrier layer 18 that is formed may vary depending on the number of diffusion barrier material layers present within layer 18, as well as the technique used in forming the same. Typically, the at least one metal diffusion barrier layer 18 that is formed has a thickness from 10 nm to 1000 nm, with a thickness from 50 nm to 300 nm being more typical.

Figure 5:
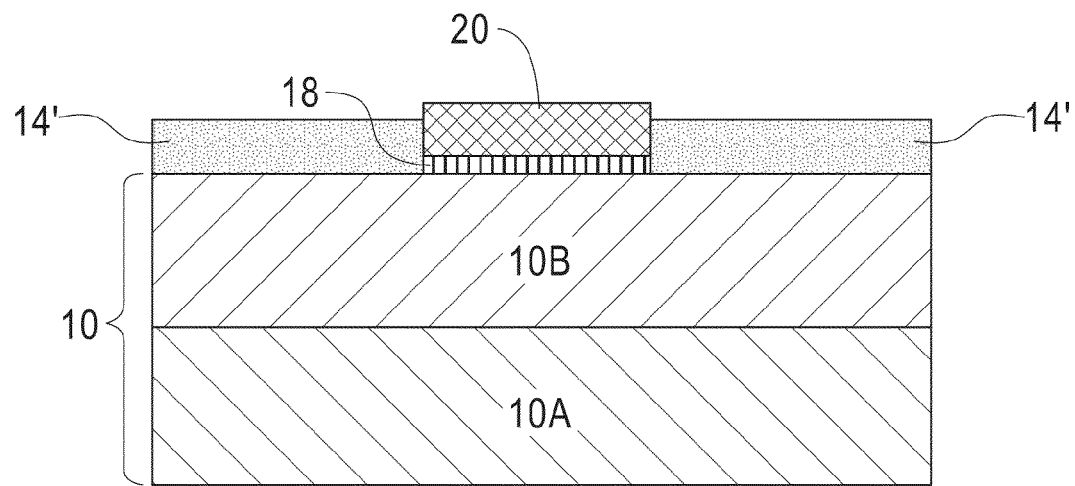
FIG. 5 is a pictorial representation (through a cross sectional view) illustrating the structure of FIG. 4 after electrodepositing a copper-containing layer having an impurity level of 200 ppm or greater on an upper surface of the at least one metal diffusion barrier layer.

Referring now to FIG. 5, there is illustrated the structure of FIG. 4 after electrodepositing a copper-containing layer 20 atop the at least one metal diffusion barrier layer 18. The copper-containing layer 20 that is formed atop the at least one metal diffusion barrier layer 18 comprises copper or a copper alloy as well as at least one impurity. The at least one impurity is present in an amount of 200 ppm or greater. In one embodiment, the copper-containing layer 20 has an impurity level from 200 ppm to 10000 ppm. In another embodiment of the present disclosure, the copper-containing layer 20 has an impurity level from 200 ppm to 1000 ppm.

As mentioned above, a photovoltaic device including a copper-containing layer 20 having an impurity level of 200 ppm or greater as a grid metallization layer provides an improvement in performance, particularly in lifetime, over a copper-containing layer whose impurity level is below 200 ppm. In some embodiments, an improvement of about 10-500%, and more typically 25-200%, in lifetime is observed for a photovoltaic device including a copper-containing layer having an impurity level of 200 ppm or greater as compared to a similar photovoltaic device including a copper-containing layer whose impurity level is below 200 ppm.

In some embodiments, the impurities within the copper-containing layer 20 can include carbon, chloride, oxygen and/or sulfur as impurities. Other impurities including, but not limited to, B, P, Sb, As, Se, Te, Br, F, I and H can also be present within the copper-containing layer 20.

In embodiments in which the impurities within the copper-containing layer 20 include carbon, the carbon impurity can be typically present within the copper-containing layer 20 in an amount from 60 ppm to 10000 ppm, with an amount from 100 ppm to 1000 ppm being more typical.

In embodiments in which the impurities within the copper-containing layer 20 include chloride, the chloride impurity can be typically present within the copper-containing layer 20 in an amount from 60 ppm to 10000 ppm, with an amount from 100 ppm to 1000 ppm being more typical.

In embodiments in which the impurities within the copper-containing layer 20 include oxygen, the oxygen impurity can be typically present within the copper-containing layer 20 in an amount from 10 ppm to 10000 ppm, with an amount from 20 ppm to 1000 ppm being more typical.

In embodiments in which the impurities within the copper-containing layer 20 include sulfur, the sulfur impurity can be typically present within the copper-containing layer 20 in an amount from 10 ppm to 10000 ppm, with an amount from 20 ppm to 1000 ppm being more typical.

The electrodeposition of copper-containing layer 20 having an impurity level of 200 ppm or greater atop the at least one metal diffusion barrier layer 18 is the same as that described above for electrodeposition of the at least one metal diffusion barrier layer 18 except that a copper source is present in the bath used in forming the copper-containing layer 20. In one embodiment, the copper source itself includes the impurity therein. In yet another embodiment, at least one impurity source can be used in conjunction with a copper source in providing the copper-containing layer 20 having an impurity level of 200 ppm or greater.

The one or more sources of copper ions that can be present in the electroplating bath to form the copper-containing layer 20 include copper salts such as, but not limited to, copper halides, copper nitrates, copper sulfates, copper sulfamates, copper alkane sulfonates, copper alkanol sulfonate, copper pyrophosphate, copper cyanides, copper acetates and copper citrates. The bath used to plate the copper-containing layer 20 having an impurity level of greater than 200 ppm may also include one or more of the sources of metal ions mentioned above in forming the at least one metal diffusion barrier layer 18.

When a separate carbon impurity source is employed, the separate carbon impurity source may include any carbon-containing material such as, but not limited to, polyethylene glycol, polyvinylpyrrolidone, citrate, thiourea, saccharin, ascorbic acid, Janus Green B, and alkyl sulfonate.

When a separate chloride impurity source is employed, the separate chloride impurity source may include any chloride-containing material such as, but not limited to, hydrochloric acid, sodium chloride, and chloride derivatives of organic polymers.

When a separate oxygen impurity source is employed, the separate oxygen impurity source may include any oxygen-containing material such as, but not limited to, polyethylene glycol, polyvinylpyrrolidone, citrate, saccharin, ascorbic acid, gluconate, alcohol and alkyl sulfonate.

When a separate sulfur impurity source is employed, the separate sulfur impurity source may include any sulfur-containing material such as, but not limited to, saccharin, thiourea, alkyl sulfonate, mercaptopropylsulfonic acid, and sulfamic acid.

The copper salts are included in the electroplating bath such that copper ions range in concentrations from 0.01 g/L to 200 g/L, or such as from 0.5 g/L to 150 g/L, or such as from 1 g/L to 100 g/L, or such as from 5 g/L to 100 g/L. Typically, copper salts are included in amounts such that copper ion concentrations range from 1 g/L to 100 g/L, more typically from 10 g/L to 100 g/L. When a separate impurity source is employed, the separate impurity source that is included in the bath in a concentration within the ranges mentioned above for the copper ions.

In some embodiments, the electrodeposition of the copper-containing layer 20 having an impurity level of 200 ppm or greater can also include light illumination (as mentioned above) to increase metal nucleation and growth during the electrodeposition process.

The copper-containing layer 20 having an impurity level of 200 ppm or greater that is electroplated atop the at least one metal diffusion barrier layer 18 has a thickness that is generally greater than the thickness of that of the at least one metal diffusion barrier layer 18. In one embodiment, the copper-containing layer 20 having an impurity level of 200 ppm or greater has a thickness from 100 nm to 50000 nm. In another embodiment, the copper-containing layer 20 has a thickness from 1000 nm to 20000 nm.

After forming the copper-containing layer 20 having an impurity level of 200 ppm or greater atop the at least one metal diffusion barrier layer 18, the copper-containing layer 20 having an impurity level of 200 ppm or greater can be further processed to include other material layers such as, but not limited to, capping layers and/or passivation layers.

Figure 6:
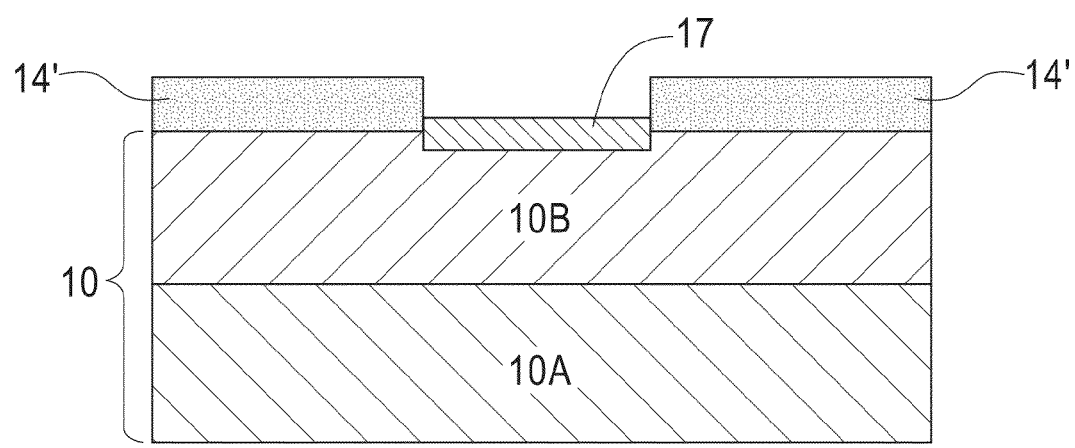
FIG. 6 is a pictorial representation (through a cross sectional view) illustrating the structure of FIG. 3 after forming a metal semiconductor alloy layer into the open grid pattern.
Figure 7:
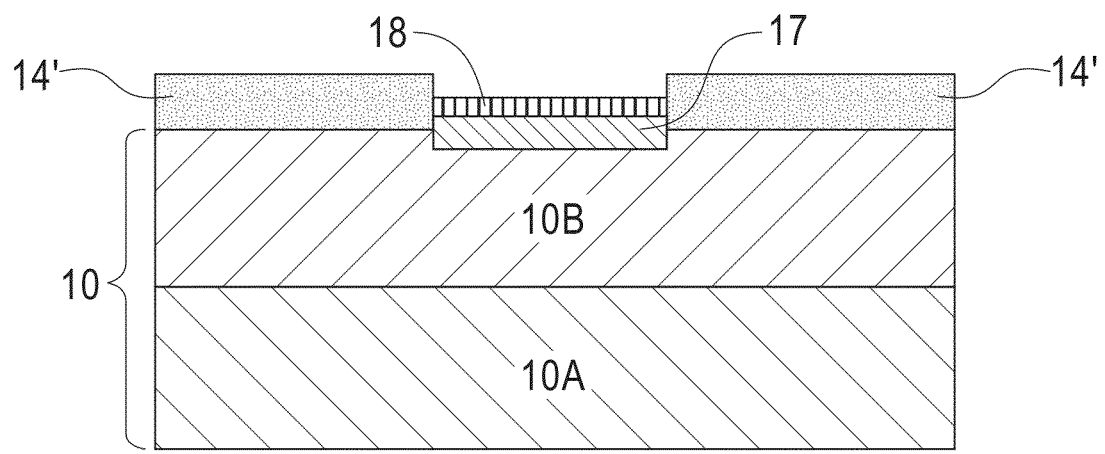
FIG. 7 is a pictorial representation (through a cross sectional view) illustrating the structure of FIG. 6 after forming at least one metal diffusion barrier layer on the metal semiconductor alloy layer.
Figure 8:
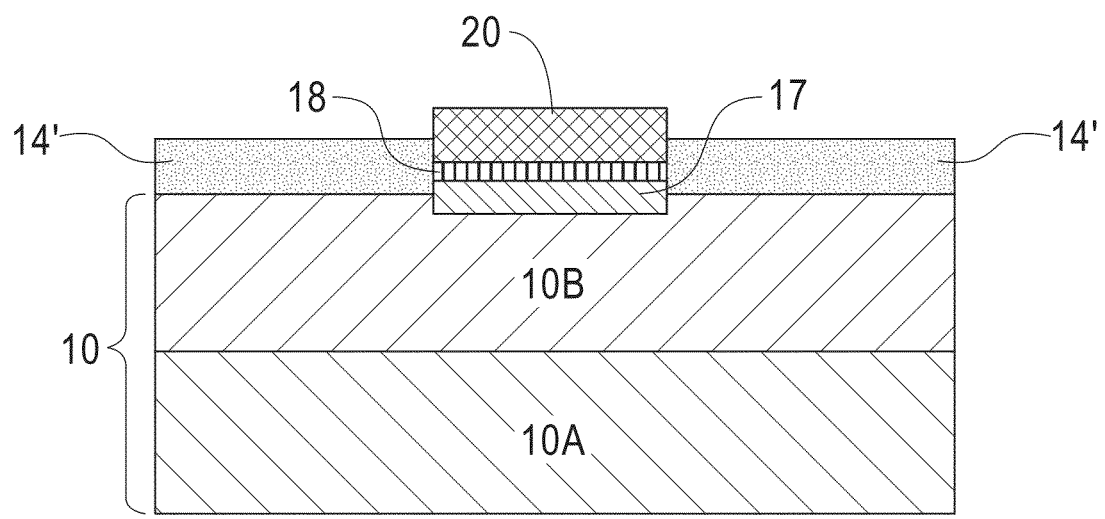
FIG. 8 is a pictorial representation (through a cross sectional view) illustrating the structure of FIG. 7 after electrodepositing a copper-containing layer having an impurity level of 200 ppm or greater on an upper surface of the at least one metal diffusion barrier layer.

Reference is now made to FIGS. 6-8 which illustrate another embodiment of the present disclosure. In this embodiment, a metal semiconductor alloy 17 is formed interposed between the exposed portions of the n-type semiconductor portion 10B of the semiconductor substrate 10 and the overlying metal diffusion barrier layer 18. In this embodiment, the metal semiconductor alloy layer 17 represents a bottom most layer of a multilayered diffusion barrier stack; the upper portion of the multilayered diffusion barrier stack includes the at least one or more metal diffusion barrier layer 18. In some embodiments (not shown), the metal semiconductor alloy can be formed interposed between the exposed portion of the p-type semiconductor portion when the substrate comprises a p-type semiconductor portion atop an n-type semiconductor portion.

Specifically, FIG. 6 illustrates the structure of FIG. 3 after forming a metal semiconductor alloy layer 17 into the open grid pattern 16, i.e., within and atop the exposed portions of the n-type semiconductor portion 10B of the semiconductor substrate 10 that are not covered by the patterned ARC layers 14'. The metal semiconductor alloy layer 17 is formed by providing a metal layer (not shown) onto the exposed portions of the n-type semiconductor portion 10B of the semiconductor substrate 10 that are not protected by the patterned ARC layers 14', and then subjecting the structure to an anneal. During the anneal, metal atoms from the metal layer react with semiconductor atoms from the underlying n-type semiconductor portion 10B forming a metal semiconductor alloy 17. The metal semiconductor alloy layer 17 thus consists of a metal and a semiconductor. In one embodiment, the metal semiconductor alloy layer 17 comprises a metal silicide such as, for example, NiSi or CoSi. In another embodiment, the metal semiconductor alloy layer 17 comprises a metal germanide such as, for example, Ni germanide or Co germanide.

The metal layer (which is not shown) can be formed by electrodeposition. The electrodeposition process is the same has used above in forming the metal diffusion barrier layer 18. Light illumination as described above can also be used in conjunction with electrodeposition to form the metal layer. The metal layer employed in forming the metal semiconductor alloy layer 17 can be formed by other deposition processes besides electrodeposition including those mentioned above in forming the at least one metal diffusion barrier layer 18.

In one embodiment of the present disclosure, the metal layer employed in forming the metal semiconductor alloy layer 17 comprises a Ni layer. In another embodiment, the metal layer employed in forming the metal semiconductor alloy layer 17 comprises a Co layer. In other embodiments, the metal layer employed in forming the metal semiconductor alloy layer 17 comprises one of Zn, Pt, Ag, Pd, Sn, Fe, In, S, P, and N.

The thickness of the metal layer that is formed and is used in forming the metal semiconductor alloy layer 17 is typically within the range from 20 nm to 500 nm, with a thickness from 100 nm to 300 nm being more typically. Other thicknesses that are above or below the aforementioned thickness ranges can also be employed in the present application.

After forming the metal layer, and as mentioned above, an anneal is performed that causes metal atoms from the metal layer to react with semiconductor atoms from the underlying semiconductor substrate 10 forming the metal semiconductor alloy layer 17. The anneal may be performed in a single step or a two-step anneal process can be used. In one embodiment, the anneal is performed at a temperature of about 250° C. or greater. In another embodiment, the anneal is performed at a temperature from 300° C. to 700° C. Annealing can be performed in air, forming gas, He, Ar, or $N_2$. The anneal includes a furnace anneal, a rapid thermal anneal, a spike anneal, a microwave anneal or a laser anneal. Typically, the anneal is a rapid thermal anneal or a belt furnace anneal in which the anneal time is about typically less than 60 minute, and more typically less than 10 minutes. In another embodiment, the metal semiconductor alloy was formed by laser heating process. Following the formation of the metal semiconductor alloy, any unreacted metal layer is optionally removed from the structure utilizing an etching process that selectively removes the unreacted metal from the structure.

The metal semiconductor alloy layer 17 that is formed after annealing has a thickness that is typically from 20 nm to 300 nm, with a thickness from 50 nm to 150 nm being more typical. Other thicknesses above and below the aforementioned ranges are also possible depending on the initial thickness of the metal layer and the conditions of the anneal used to convert the metal layer to the metal semiconductor alloy layer 17.

In some embodiments, and as shown in FIG. 6, the metal semiconductor alloy layer 17 is a continuous layer. By "continuous", it is meant that the metal semiconductor alloy layer 17 that is formed has no breaks in the entire length of the substrate that it is formed upon. In another embodiment, the metal semiconductor alloy layer 17 is discontinuous, i.e., there is at least one break in the metal semiconductor alloy layer 17 such that the entire surface of the underlying substrate is not completely covered by the metal semiconductor alloy layer 17. It is noted that a continuous metal semiconductor alloy layer 17 is optional in the present disclosure since the at least one metal diffusion barrier layer 18 (to be subsequently formed atop the metal semiconductor alloy layer 17) serves as a diffusion barrier in the disclosed photovoltaic device.

Referring now to FIG. 7, there is illustrated the structure of FIG. 6 after forming at least one metal diffusion barrier layer 18 on the metal semiconductor alloy layer 17. The at least one metal diffusion barrier layer 18 employed in this embodiment of the present disclosure is the same as that described above. Also, the methods described in forming the at least one metal diffusion barrier layer 18 can also be used in this embodiment as well.

Referring now to FIG. 8, there is illustrated the structure of FIG. 7 after electrodepositing a copper-containing layer 20 having an impurity level of 200 ppm or greater on an upper surface of the at least one metal diffusion barrier layer 18. The copper-containing layer 20 having an impurity level of 200 ppm or greater employed in this embodiment of the present disclosure is the same as that described above. Also, the electrodeposition method described in forming the copper-containing layer 20 having an impurity level of 200 ppm or greater can also be used in this embodiment as well.

The following example is provided to illustrate some advantages of the photovoltaic device of the present disclosure over prior art photovoltaic devices.

EXAMPLE

In this example, solar cells where prepared each including a Ni silicide layer atop exposed surface of an n-type silicon portion of a silicon substrate; a p-type silicon portion is located beneath the n-type silicon portion. In each device, the Ni silicide layer was prepared as described above for metal semiconductor alloy layer 17. Next, a Ni diffusion barrier layer was formed atop the Ni silicide layer of each device using the method described above for forming metal diffusion barrier layer 18. Next, a copper-containing layer was formed atop the Ni diffusion barrier layer. Each of the copper-containing containing layers included carbon, oxygen, sulfur and chloride as impurities. In one case, Example 1, the impurity level was greater than 200 ppm. In the other three cases, CE1, CE2, CE3, the impurity level was lower than 200 ppm. As such, CE1, CE2 and CE3 are outside the scope of the present disclosure, while Example 1 is in accordance with the present disclosure. The different impurity levels in the copper layer were achieved by changing the carbon-, sulfur-, oxygen-, and/or chloride-containing additives, or by changing the concentrations of the above impurities.

Each copper-containing layer was prepared by electrodeposition as described above for copper-containing layer 20. The following table illustrates the impurities and impurity level within each of the devices.

| Impurity | Example 1 | CE 1 | CE 2 | CE3 |
| --- | --- | --- | --- | --- |
| Carbon | 107.5 ppm | 49.3 ppm | 9.9 ppm | 3.6 ppm |
| Oxygen | 14.7 ppm | 5.7 ppm | 2.1 ppm | 1.6 ppm |
| Sulfur | 20.3 ppm | 9.6 ppm | 2 ppm | 0.2 ppm |
| Chloride | 105.6 ppm | 46.9 ppm | 11.2 ppm | 0.4 ppm |

Figure 9:
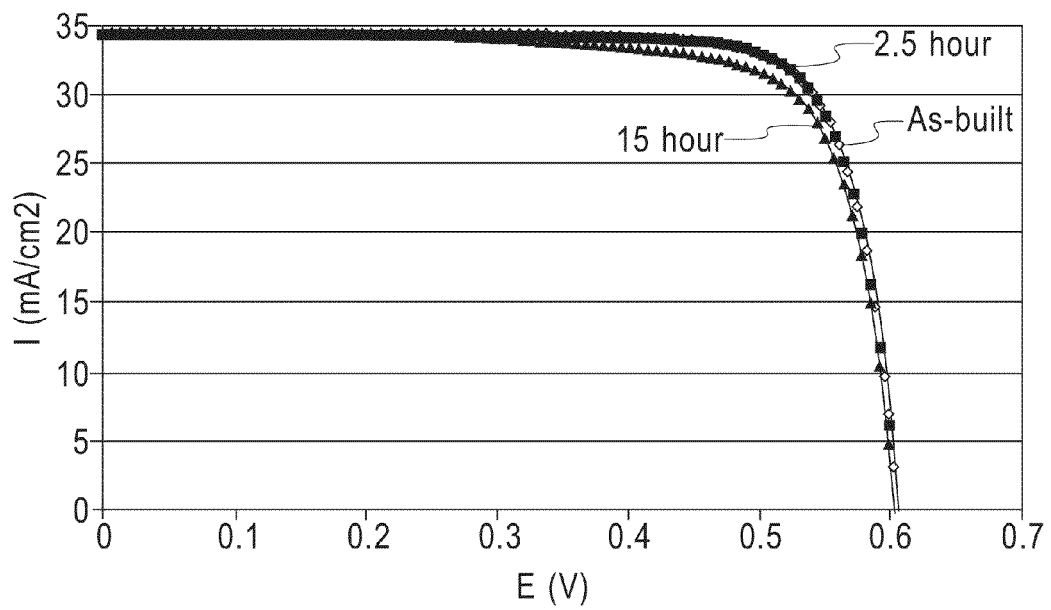
FIG. 9 is a plot of current, I (mAmps/cm$^2$), vs. potential, E(V), for a photovoltaic device containing a copper-containing layer having an impurity level of 200 ppm in accordance with the present disclosure.
Figure 10:
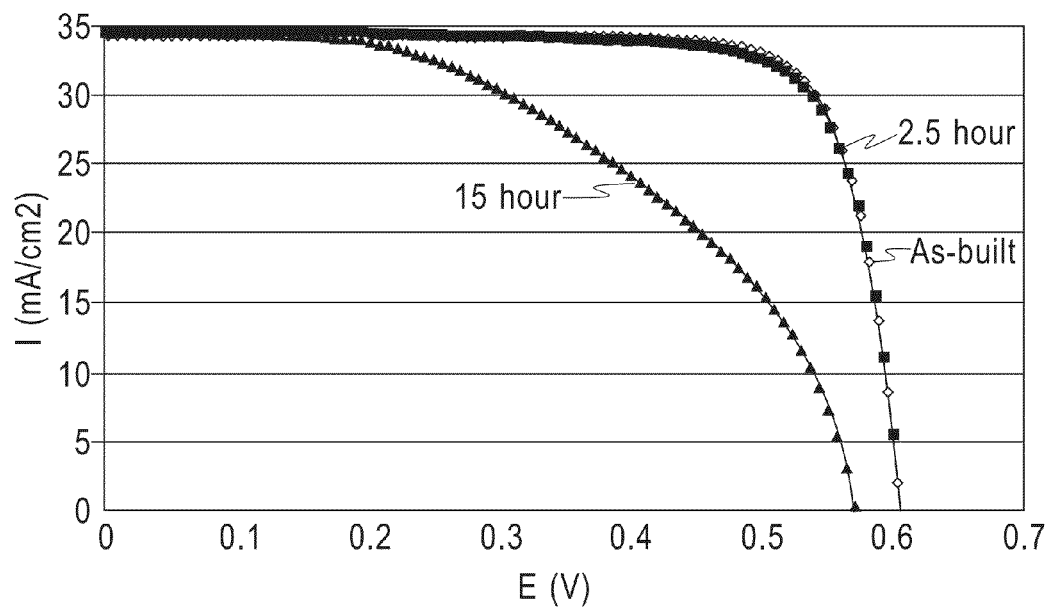
FIGS. 10-12 are plots of current, I (mAmps/cm$^2$), vs. potential, E (V), for photovoltaic devices containing a copper-containing layer having an impurity level of below 200 ppm not in accordance with the present disclosure.
Figure 11:
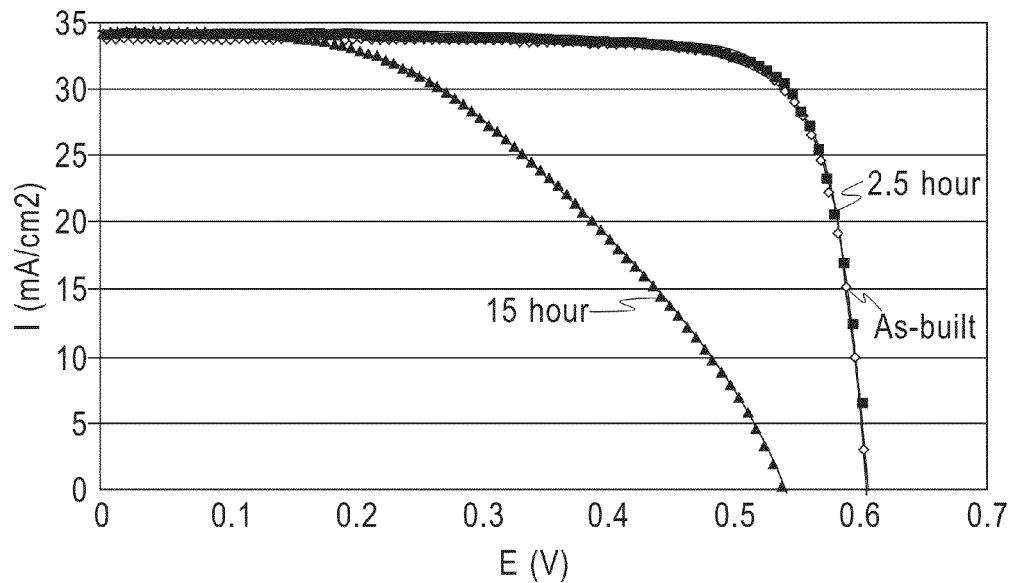
Figure 12:
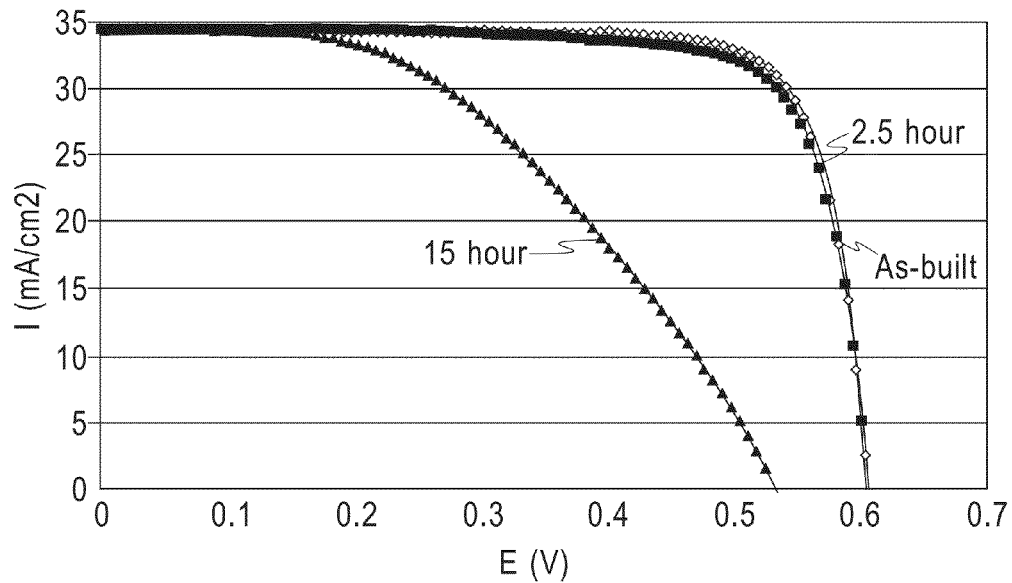

The devices within Example 1, CE 1, CE 2, and CE 3 were then tested to determine the lifetime of each device following no anneal (as built), annealing in He at 200° C. for 2.5 hours and annealing in He at 200° C. for 15 hours. FIGS. 9 (illustrative of Example 1 devices), 10 (illustrative of CE1 devices), 11 (illustrative of CE2 devices) and 12 (illustrative of CE3) devices illustrate plots of current, I (mAmps/cm$^2$), vs. potential, E(V). As can be seen in each of the plots, the as-built devices and the devices that were annealed for 2.5 hours had nearly identical I vs. E characteristics for all cases, indicating a lifetime longer than 2.5 hours for all cases. As shown in FIG. 9, the devices of Examples 1 containing a copper-containing layer having an impurity level of 200 ppm or greater, showed a nearly identical I vs. E characteristics after 15 hours as the as built devices, suggesting a lifetime longer than 10 hours. However, the devices with impurities less than 200 ppm, as shown in FIG. 10-12, showed a significant drop in the I vs. E characteristics, suggesting a lifetime shorter than 15 hours.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
   a semiconductor substrate including a p-n junction with a p-type semiconductor portion and an n-type semiconductor portion one on top of the other, wherein an upper exposed surface of one of the semiconductor portions represents a front side surface of the semiconductor substrate;
   patterned antireflective coatings on the front side surface of the semiconductor substrate, wherein said patterned antireflective coatings protect some portions of the front side surface of the semiconductor substrate, while leaving other portions of the front side surface of the semiconductor substrate exposed, said other portions of the front side surface of the semiconductor substrate that are exposed form a grid pattern on the front side surface;
   at least one metal diffusion barrier layer located directly on the other portions of the front side surface of the semiconductor substrate that are exposed, wherein said at least one metal diffusion barrier is selected from the group consisting of a metal other than copper, and a metal alloy containing two metal elements other than a copper alloy; and
   a copper-containing layer having an impurity level of 200 ppm or greater located directly on an upper surface of the at least one metal diffusion barrier layer, wherein said at least one metal diffusion barrier layer and said copper-containing layer have sidewall surfaces that are vertically coincident with each other and said sidewalls surfaces of said at least one metal diffusion barrier layer and said copper-containing layer are in direct physical contact with a sidewall surface of one of said patterned antireflective coatings, and wherein said copper-containing layer has a topmost surface that extends above an entirety of a topmost surface of each patterned antireflective coating.

2. The photovoltaic device of claim 1, wherein said copper-containing layer having said impurity level of 200 ppm or greater comprises copper or a copper alloy and at least one impurity.

3. The photovoltaic device of claim 2, wherein said at least one impurity comprises carbon, oxygen, chloride, sulfur or any combination thereof.

4. The photovoltaic device of claim 3, wherein said at least one impurity includes a combination of carbon, oxygen, chloride and sulfur.

5. The photovoltaic device of claim 4, where said carbon impurity is present in an amount from 60 ppm to 10000 ppm, said oxygen impurity is present in an amount from 10 ppm to 10000 ppm, said chloride impurity is present in an amount from 60 ppm to 10000 ppm, and said sulfur impurity is present in an amount from 10 ppm to 10000 ppm.

6. The photovoltaic device of claim 1, wherein said n-type semiconductor portion overlies said p-type semiconductor portion.

7. The photovoltaic device of claim 1, wherein said at least one metal diffusion barrier comprises a nickel layer and said copper-containing layer comprises copper and a combination of carbon, oxygen, chloride and sulfur as impurities, and wherein said nickel layer is in direct contact with the exposed portions of the front side surface of the semiconductor substrate.

8. The photovoltaic device of claim 1, wherein said at least one metal diffusion barrier layer comprises a cobalt layer and said copper-containing layer comprises copper and a combination of carbon, oxygen, chloride and sulfur as impurities, and wherein said cobalt layer is in direct contact with the exposed portions of the front side surface of the semiconductor substrate.

9. A photovoltaic device comprising:
a semiconductor substrate including a p-n junction with a p-type semiconductor portion and an n-type semiconductor portion one on top of the other, wherein an upper exposed surface of one of the semiconductor portions represents a front side surface of the semiconductor substrate;
patterned antireflective coatings on the front side surface of the semiconductor substrate, wherein said patterned antireflective coatings protect some portions of the front side surface of the semiconductor substrate, while leaving other portions of the front side surface of the semiconductor substrate exposed, said other portions of the front side surface of the semiconductor substrate that are exposed form a grid pattern on the front side surface;
a metal semiconductor alloy layer located on the exposed front side surface of said semiconductor substrate, wherein said metal semiconductor alloy layer has a bottommost surface that is located beneath a topmost surface of said front side surface of said semiconductor substrate, a topmost surface that is located entirely above said topmost surface of said front side surface of said semiconductor substrate and sidewall surfaces that are in direct physical contact with a sidewall surface of said patterned antireflective coatings;
at least one metal diffusion barrier layer located directly on a surface of said metal semiconductor alloy layer, wherein said at least one metal diffusion barrier is selected from the group consisting of a metal other than copper, and a metal alloy containing two metal elements other than a copper alloy; and
a copper-containing layer having an impurity level of 200 ppm or greater located directly on an upper surface of the at least one metal diffusion barrier layer, wherein said metal semiconductor alloy layer, said at least one metal diffusion barrier layer, said copper-containing layer have sidewall surfaces that are vertically coincident with each other and said sidewalls surfaces of said at least one metal diffusion barrier layer and said copper-containing layer are in direct physical contact with a sidewall surface of one of said patterned antireflective coatings, and wherein said copper-containing layer has a topmost surface that extends above an entirety of a topmost surface of each patterned antireflective coating.

10. The photovoltaic device of claim 1, wherein said at least one metal diffusion barrier layer comprises a cobalt layer, said copper-containing layer comprises copper and a combination of carbon, oxygen, chloride and sulfur as impurities, and said metal semiconductor alloy layer comprises nickel silicide.

11. The photovoltaic device of claim 1, wherein said semiconductor substrate is a component of a solar cell.

12. The photovoltaic device of claim 1, wherein said photovoltaic device comprising the copper-containing layer having an impurity level of 200 ppm or greater has a lifetime that is 25% to 200% greater than an equivalent photovoltaic device including a copper-containing layer having an impurity level of below 200 ppm.

13. The photovoltaic device of claim 1, wherein said metal diffusion barrier layer is located directly on said exposed portions of the front side surface of the semiconductor substrate, and said metal diffusion barrier is an elemental metal or elemental metal alloy selected from one of Ni, Co, Zn, Pt, Ag, Pd, Sn, and In.

14. The photovoltaic device of claim 13, wherein said metal diffusion barrier layer consists of Co or Ni.

15. The photovoltaic device of claim 1, wherein said front side surface of said semiconductor substrate is entirely textured or entirely non-textured.

16. The photovoltaic device of claim 9, wherein said at least one metal diffusion barrier layer comprises a nickel layer, said copper-containing layer comprises copper and a combination of carbon, oxygen, chloride and sulfur as impurities, and said metal semiconductor alloy comprises nickel silicide.

* * * * *